United States Patent [19]

Hirano et al.

[11] Patent Number: 5,063,656
[45] Date of Patent: Nov. 12, 1991

[54] APPARATUS FOR MAKING A WIRE HARNESS

[75] Inventors: Koji Hirano, Matsuda; Hiroshi Yamashita, Kunitachi, both of Japan

[73] Assignee: AMP Incorporated, Harrisburg, Pa.

[21] Appl. No.: 540,030

[22] Filed: Jun. 19, 1990

[30] Foreign Application Priority Data

Jun. 27, 1989 [JP] Japan ................................. 1-164894

[51] Int. Cl.$^5$ ............................................ B23P 19/00
[52] U.S. Cl. ..................................... 29/749; 29/33 M; 29/564.6; 29/753; 29/861; 29/867
[58] Field of Search ................. 29/753, 749, 840, 740, 29/861, 867, 564.4, 564.6, 564.8, 33 M

[56] References Cited

U.S. PATENT DOCUMENTS

| | | |
|---|---|---|
| 3,612,369 | 10/1971 | Grebe et al. |
| 3,636,611 | 1/1972 | Rosenbaum ........................ 29/753 X |
| 4,403,407 | 9/1983 | Mazzola ............................ 29/753 X |
| 4,653,160 | 3/1987 | Thorkildsen et al. ............. 29/749 X |
| 4,856,187 | 8/1989 | Blaha .............................. 29/564.6 X |
| 4,862,587 | 9/1989 | Nakata et al. .................... 29/753 X |

FOREIGN PATENT DOCUMENTS

50-36027 11/1975 Japan .

*Primary Examiner*—Carl J. Arbes
*Attorney, Agent, or Firm*—Allan B. Osborne; Adrian J. LaRue

[57] ABSTRACT

A method and apparatus for forming a Y-shaped wire harness (23) having a pair of wires (2,3) and for orientating the wires (2,3) in a specific orientation. More particularly the apparatus includes jaws (12) for orientating the wires (2,3), an identification member (14) for holding the wires (2,3) in that orientation during termination of one ends thereof and a guide member (18) for receiving and storing the wire harness (23) with the wires (2,3) in the specific orientation.

4 Claims, 10 Drawing Sheets

APPARATUS FOR MAKING A WIRE HARNESS

FIELD OF THE INVENTION

The present invention relates to a method for making a Y-shaped lead or wire harness of two wires crimped to a common terminal at one end of both wires and of orientating the harness for subsequent work therewith and also to the apparatus for orientating the harness.

BACKGROUND OF THE INVENTION

In making a Y-shaped lead or harness, it is required to identify the two lead wires after completion of the harness for assembly operation such as connection to other harness, insertion to a connector housing, etc. which hereto now have been carried out manually.

Such manual operation to identify one lead wire from the other is extremely difficult and inefficient, especially when the two lead wires are identical in color and length.

The present invention, therefore, intends to provide a method and apparatus for making such wire harness and simultaneously identifying the lead wires without the need for manual identification of each of the two wires.

SUMMARY OF THE INVENTION

According to the present invention, a method for making a wire harness with the wires being held in a specific orientation is disclosed. The method includes the steps of orientating and holding a pair of wires during terminating one ends of the wire to form the harness and transferring the harness to a guide member with the wires maintained in the specific orientation. The present invention further provides an apparatus for practicing the aforementioned method.

DESCRIPTION OF THE INVENTION

Figure 10:
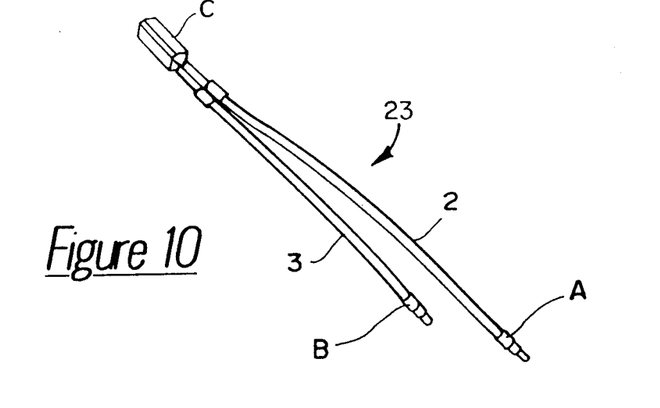
FIG. 10 is a perspective view of one example of the wire harness to be made by the apparatus according to the present invention.

A Y-shaped lead or harness 23 as shown in FIG. 10 comprises wires 2 and 3 crimped to independent terminals A and B at the first or front ends and to a common terminal C at the second or back ends. Naturally, insulation covers of the lead wires 2, 3 at the first ends thereof are stripped before crimping respective terminals thereon.

An apparatus to cut the second end of a wire having a terminal crimped at a front end and to crimp another terminal onto the cut end is known and disclosed in, for example, Japanese Patent Publication No. 36027/75. That is, a wire having a terminal crimped onto a front end in the previous step is intermittently fed along the wire feeding path.

Figure 1:
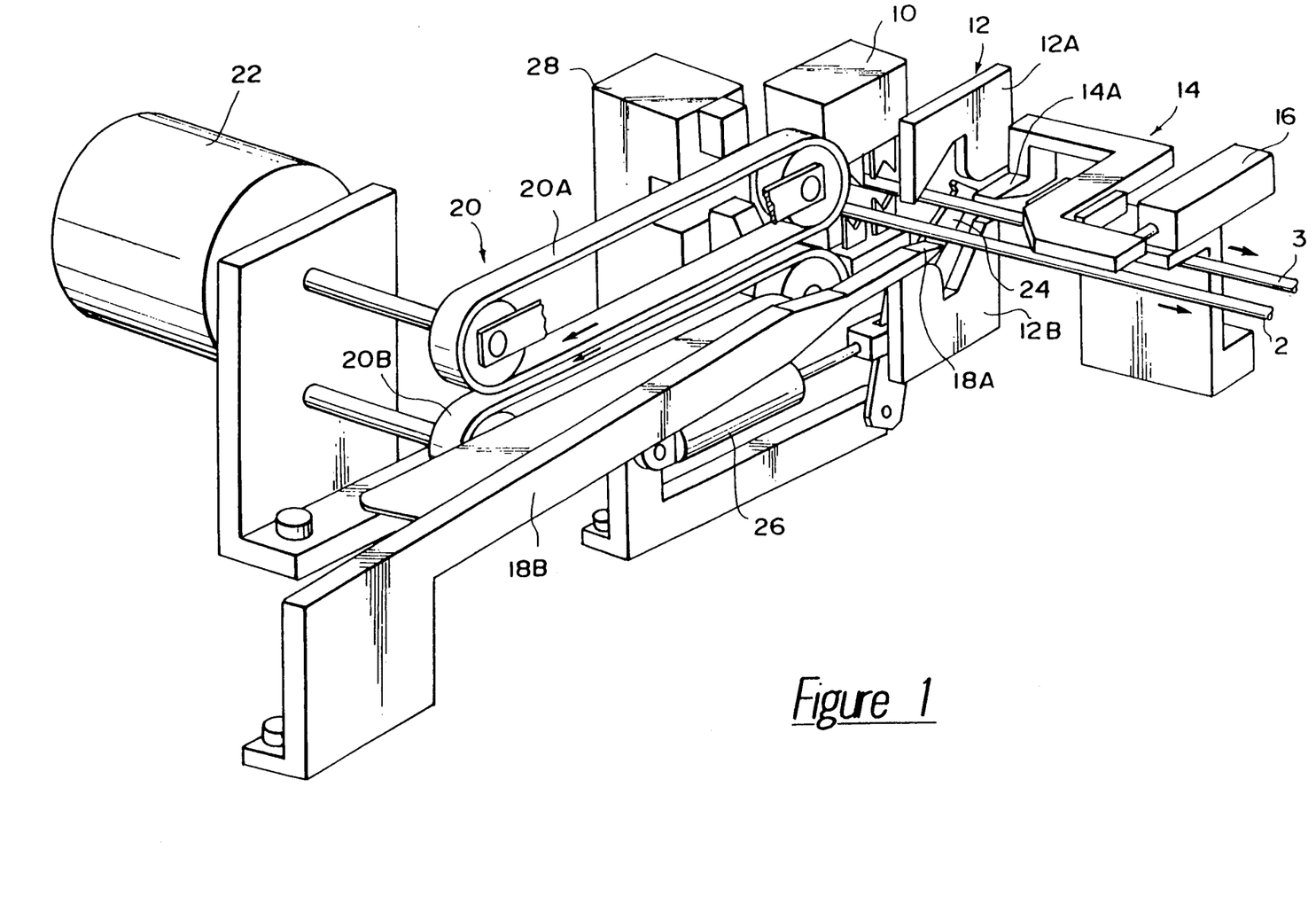
FIGS. 1 through 9 are perspective views illustrating different steps of one embodiment of the harness making method and apparatus according to the present invention with the terminal crimping apparatus and wire cutting and stripping section omitted in FIGS. 2, 4 and 6 through 9, only the terminal crimping apparatus omitted in FIG. 3, and only the wire cutting and stripping section omitted in FIG. 5.

Illustrated in FIGS. 1 through 9 are steps of sequential operations by one embodiment of the apparatus exercising the method of the present invention. FIG. 1 shows a process of feeding a predetermined length of two wires 2, 3 with the front ends having a crimped terminal as described hereinbefore. (The terminals at the front ends are not shown in FIG. 1.)

Along the feeding path feeding wires 2, 3 by feeding rollers (not shown), are disposed a wire cutting and stripping section 10 to cut and strip the wires, a pair of jaws 12 (12A, 12B) at upper and lower sides of the two wires 2, 3 for vertically stacking the wires, and an identification member 14 having a chisel-shaped spreader 14A for insertion between the vertically stacked wires from one side of the jaw 12.

The identification member 14 is horizontally movable by driving cylinder 16. Also provided is a guide member 18 having a chisel-shaped front edge 18A similar to and facing spreader 14A to be inserted between the two wires 2, 3. The guide member 18 is provided with a long guide rail 18B attached to front edge 18A and extending in the direction substantially normal to the wire feeding path. The guide rail 18B is mounted on a main body of the apparatus. A pair of belt conveyor 20 (20A, 20B) are disposed to hold and transfer the wire harness along the guide rail 18B. A driving motor 22 continuously rotates the pair of belt conveyors 20A, 20B in the direction as shown by the arrows.

Additionally, a wire harness ejecting member 24 driven by driving cylinder 26 is provided for ejecting the finished wire harness 23 toward the belt conveyor 20.

The jaw 12 as well as the identification member 14 are installed on a common base table as a unitary wire jar system movable in both the horizontal and vertical directions.

The aforementioned terminal crimping apparatus 28 for crimping the terminals are disposed adjacent to the wire cutting and stripping section 10 to crimp terminal C onto the ends of the cut wires 2, 3 by a known technique.

The jaws 12 comprise a pair of upper and lower jaw members 12A, 12B to hold the horizontally parallel wires 2, 3 in a vertically stacked fashion as illustrated in detail in FIG. 10. The upper and lower jaw members 12A, 12B have asymmetrical wire guiding surfaces. That is, as shown in FIGS. 11A-11D, the lower jaw member 12B has a push-up surface 12B1 to push up the left wire 2 and a slope 12B2 to guide the right wire 3 downwardly at a certain slope. Similarly, the upper jaw member 12A has a push-down surface 12A2 to push down the right wire 3 and a slope 12A1 to guide the left wire 2 upwardly at a certain slope. By sliding both jaw members 12A, 12B toward each other (i.e., the jaw member 12A downwardly, the jaw member 12B upwardly), the two wires 2, 3 gradually move up and down and also toward the center portion as illustrated in FIGS. 11A through 11C until they reach the vertically aligned final form as shown in FIG. 11D.

Figure 2:
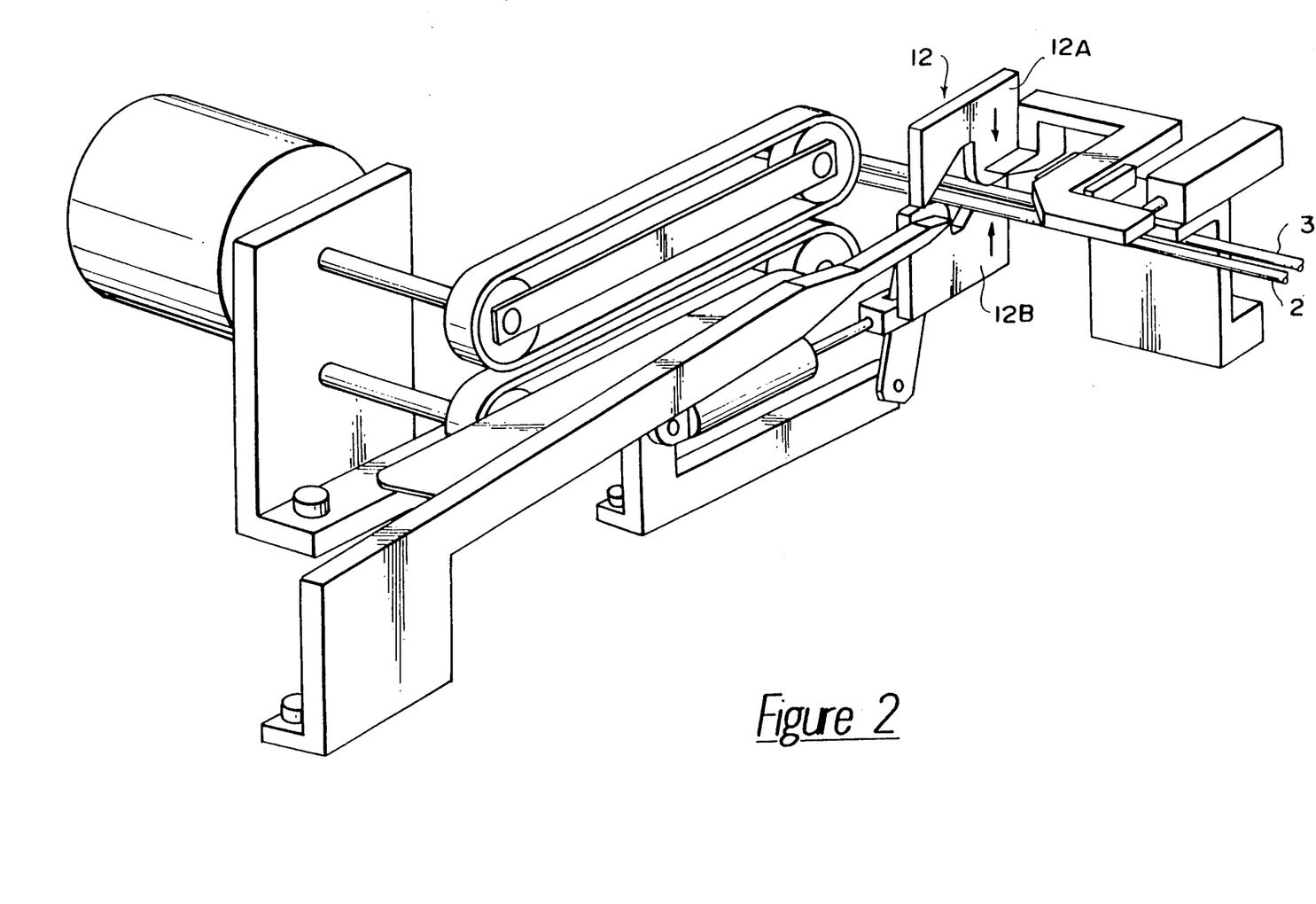
Figure 3:
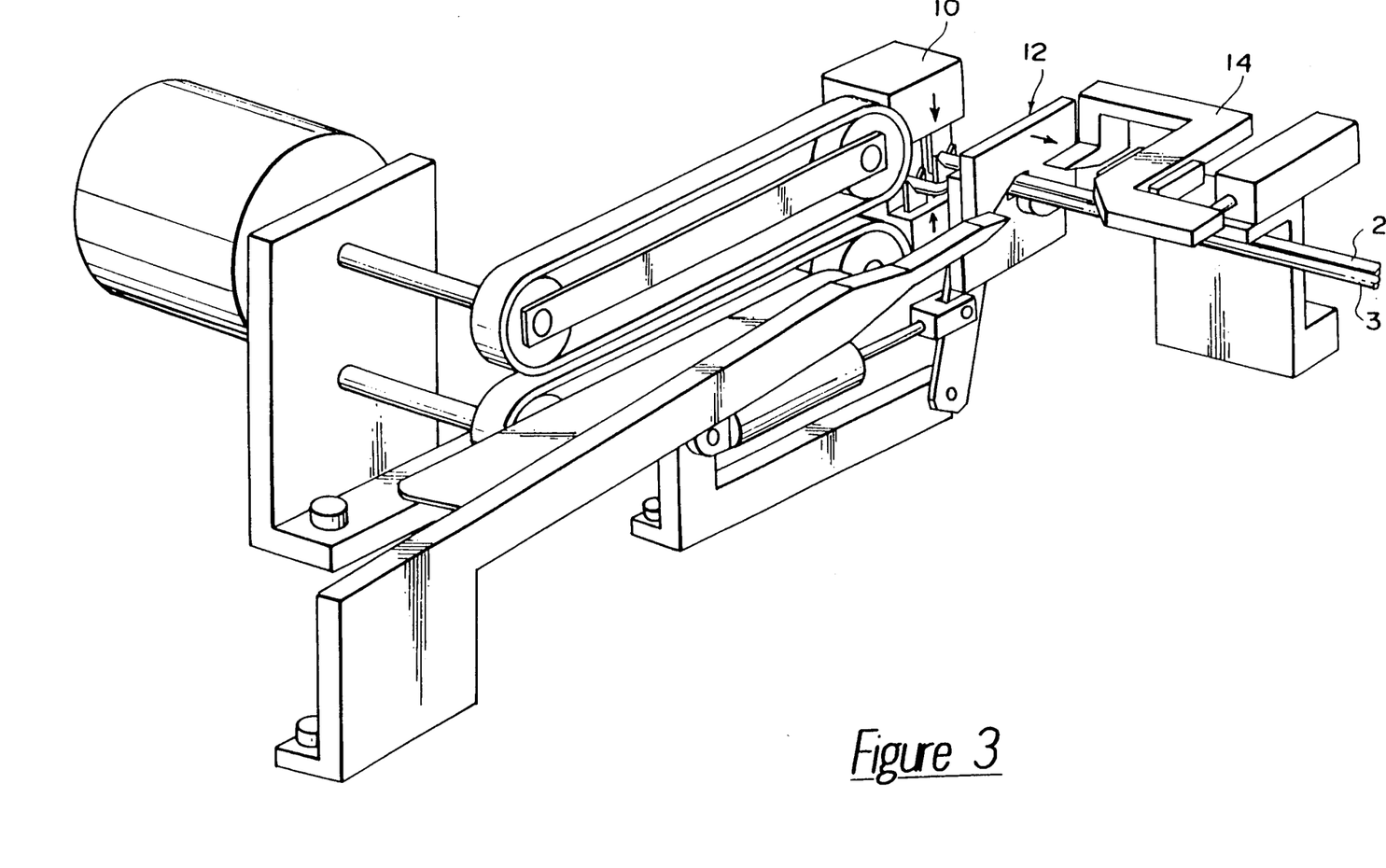
Figure 11:
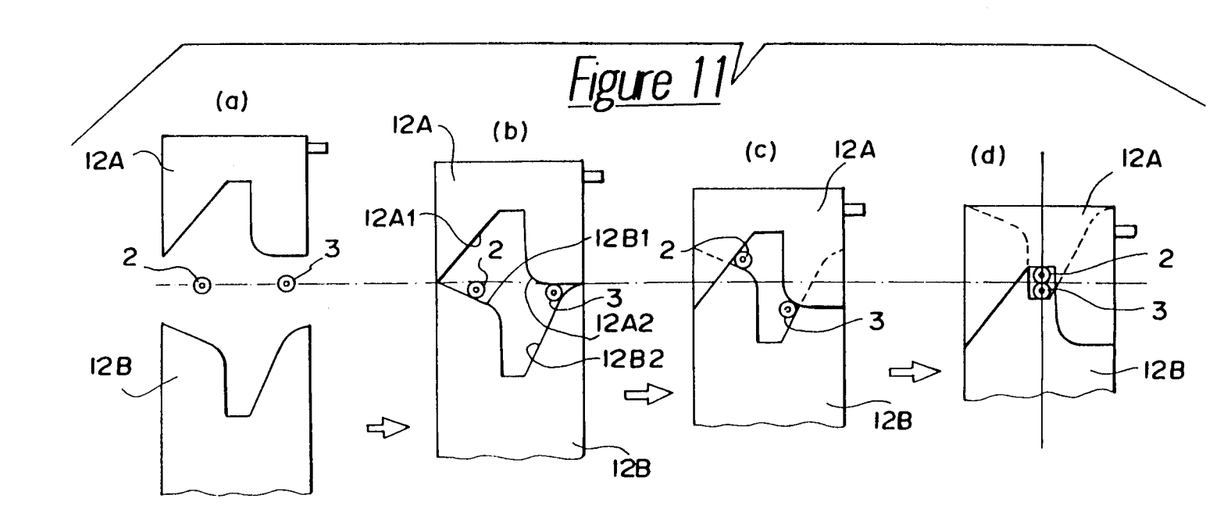
FIGS. 11A-11D illustrate how the jaw to be used in the present invention operates.

Illustrated in FIGS. 2 and 3 are the ways how the two wires 2, 3 are held by the jaw 12 grabbing from the upper and lower directions as shown in FIG. 11. FIG. 3 also shows the wire cutting and stripping section 10 having a pair of upper and lower cutting blades for individually cutting the two wires 2, 3. In this step, the two wires 2, 3 are cut and their insulations are stripped by the wire stripping blades. For stripping the insulation, the jaws 12 move forward while the stripping blades bite vertically into the clamped wires 2, 3, thereby stripping away the insulation covers (see FIG. 3).

Figure 4:
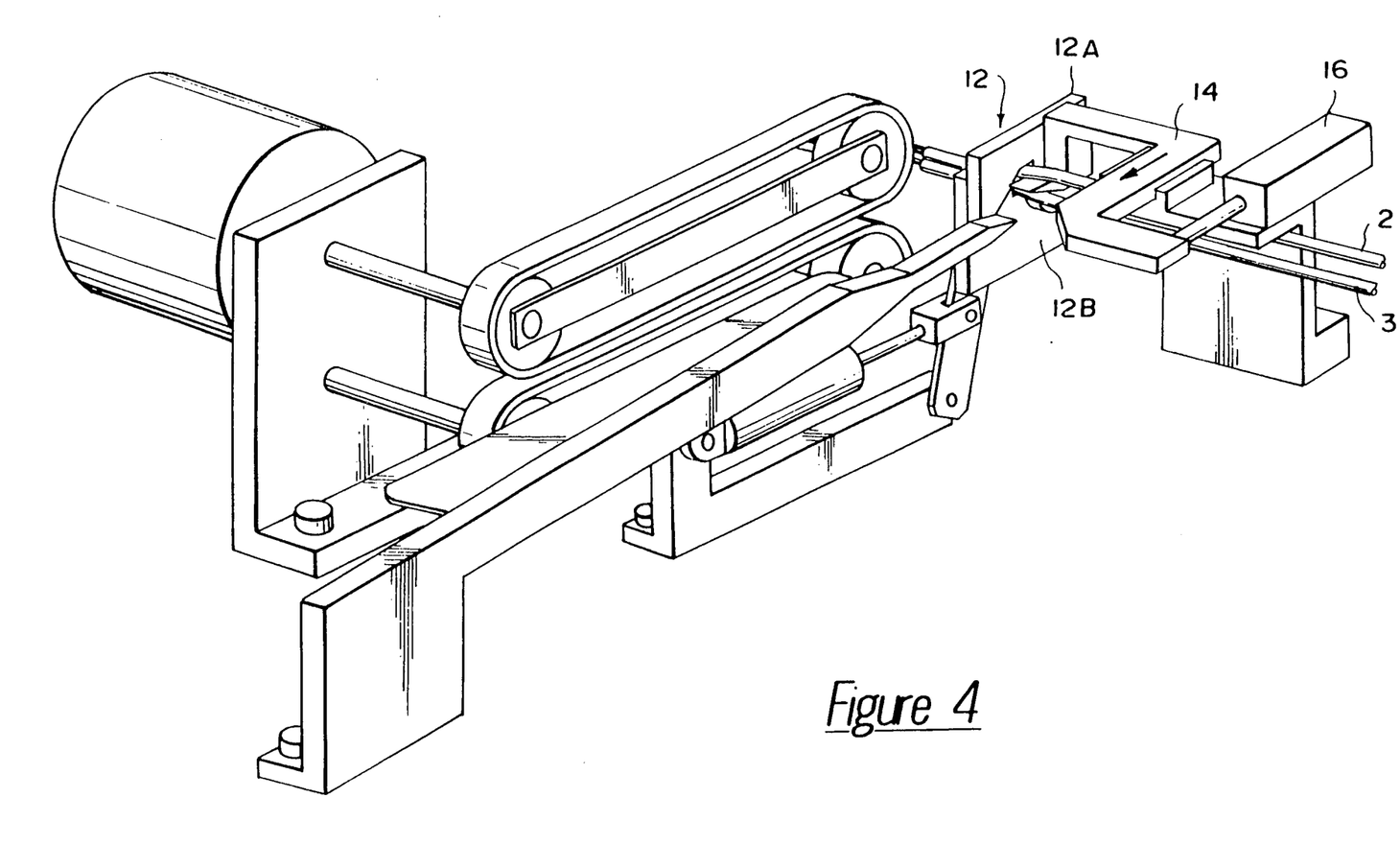

Referring now to FIG. 4, spreader 14A of the identification member 14 is driven by the cylinder 16 to move in between wires 2, 3 held by the jaw 12 in a vertically stacked manner.

Figure 5:
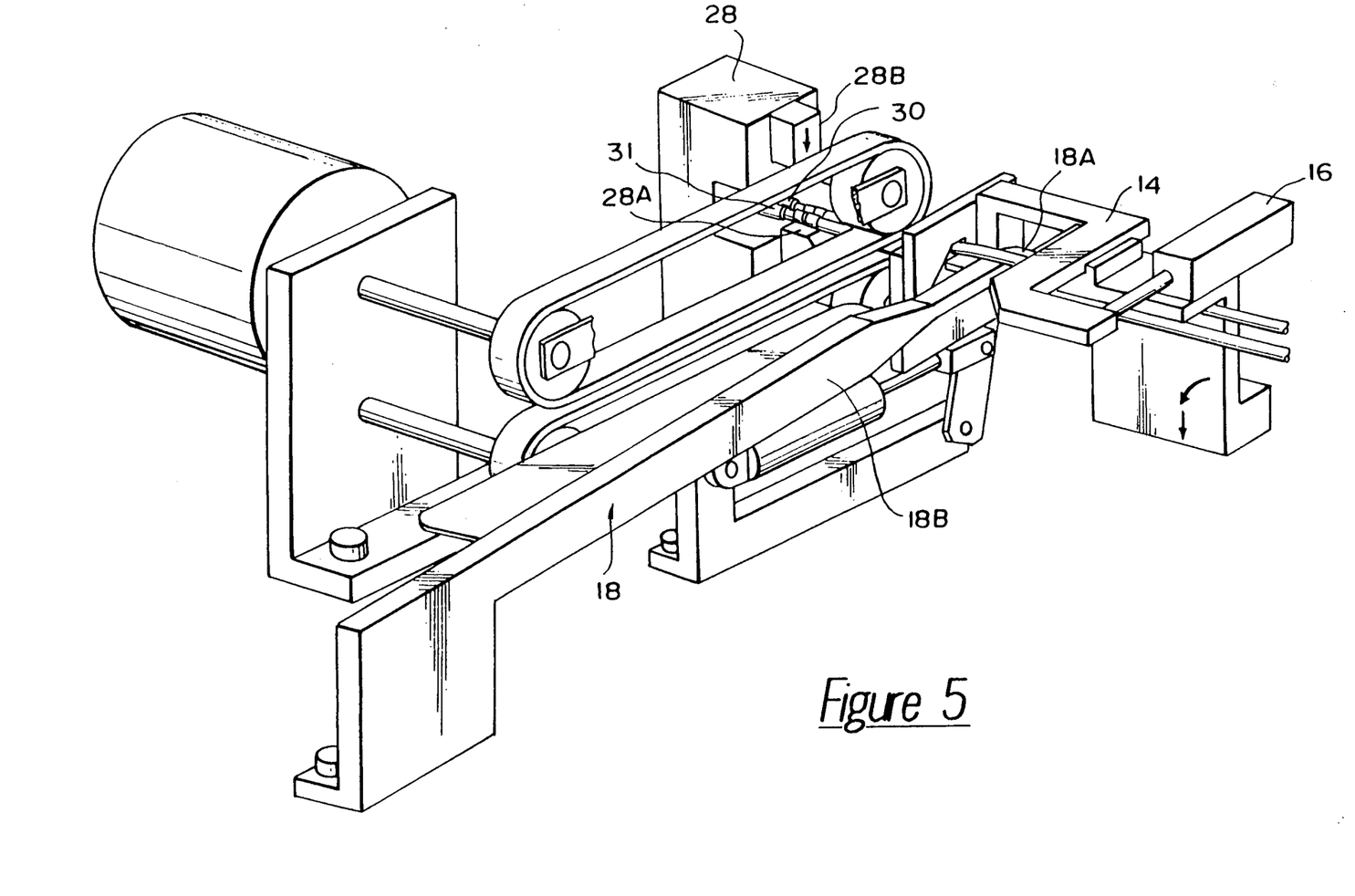

Then, the entire wire jaw system supporting the identification member 14 and the jaw 12 move to the left as shown in FIG. 5 to rotate the wires 2, 3 with the front ends thereof as the center. The back ends of the cut wires 2, 3 are moved on an anvil 28A of the terminal crimping apparatus 28 and also move down slightly to set the back ends of the wires on anvil 28A. During the horizontal movement of the two wires 2, 3, the front edge 18A of the guide member 18 is inserted between the two wires 2, 3 adjacent to the spreader 14A.

A terminal C is crimped by crimper 28B of the terminal crimping apparatus 28 onto the second ends of wires 2, 3 on anvil 28A. Simultaneously, respective terminals A, B are crimped onto the front ends of the subsequent two wires. (It is to be noted, however, that the crimping may not be simultaneously.)

Figure 6:
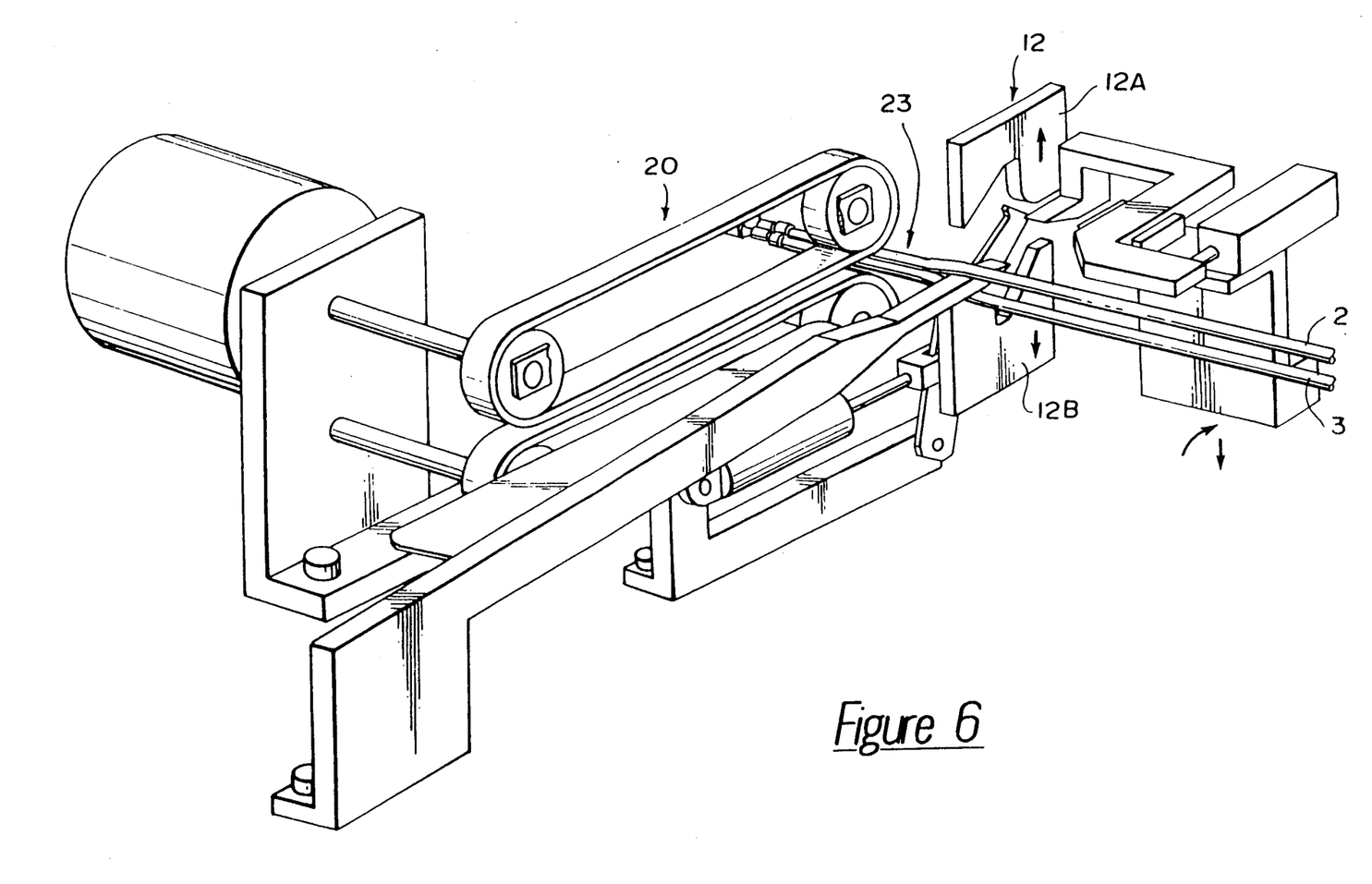

Then, the jaw 12 opens vertically to release the finished wire harness 23 as shown in FIG. 6. The jaw system moves to the right and upwardly to return to the initial position. The identification member 14 also returns to its initial position.

Figure 7:
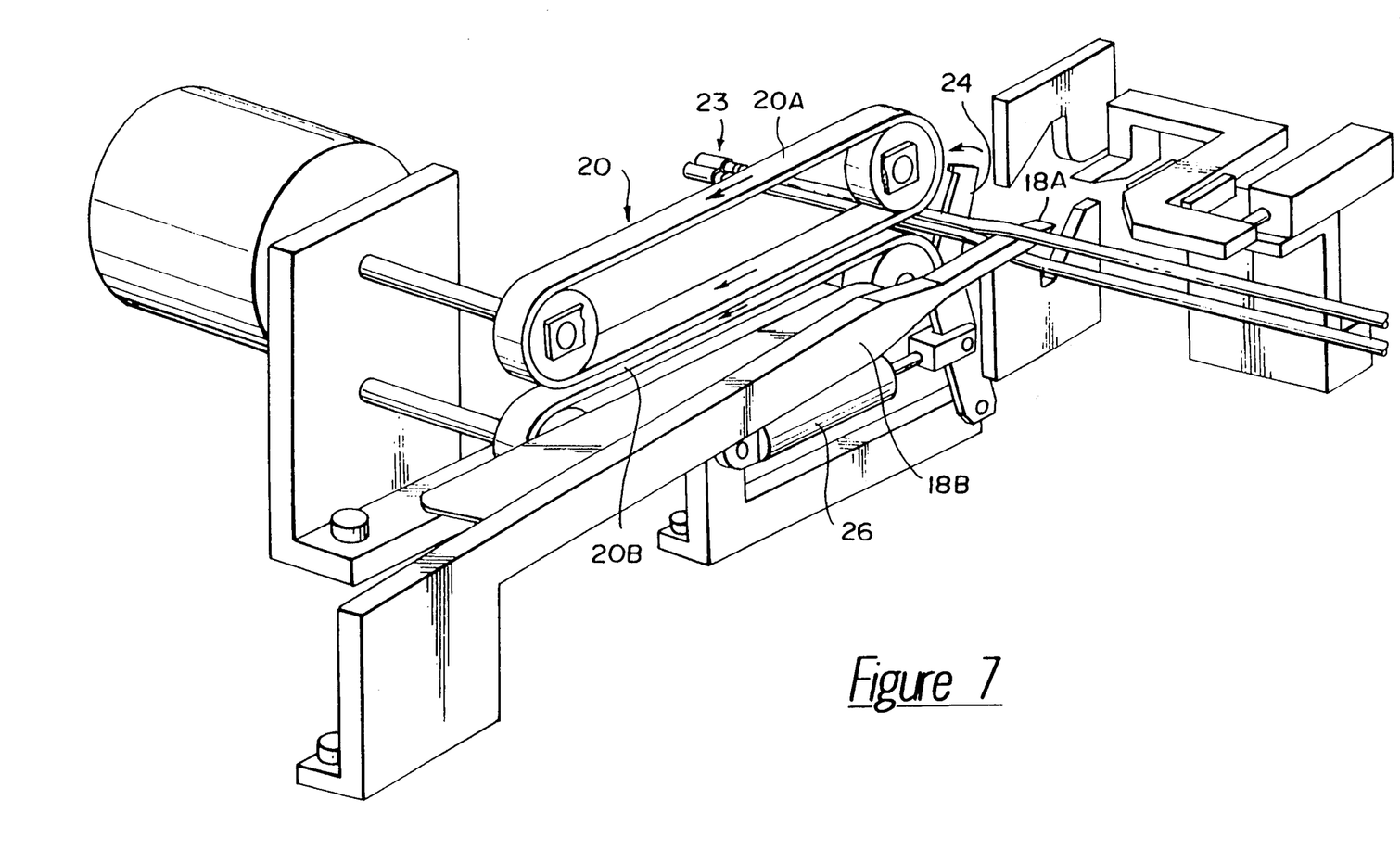

Subsequently, the harness ejecting member 24 is driven by a cylinder 26 to rotate in the direction as indicated by the arrow. The finished wire harness 23 is pushed in the gap between the two vertically aligned belt conveyors 20A, 20B.

Figure 8:
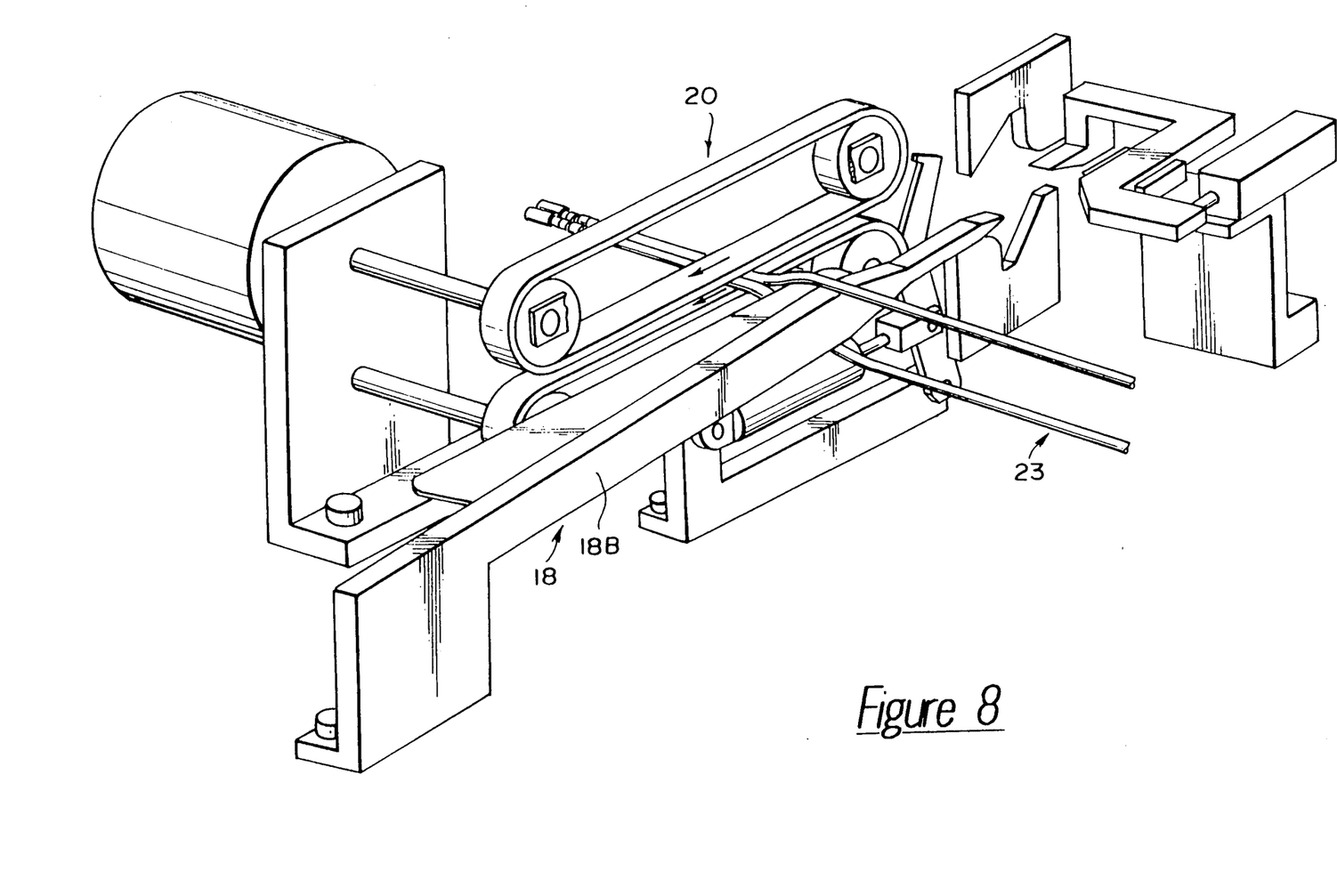

The belt conveyor 20 holds the wire harness and transfers it along the guide rail 18B of the guide member 18 as shown in FIG. 8.

Figure 9:
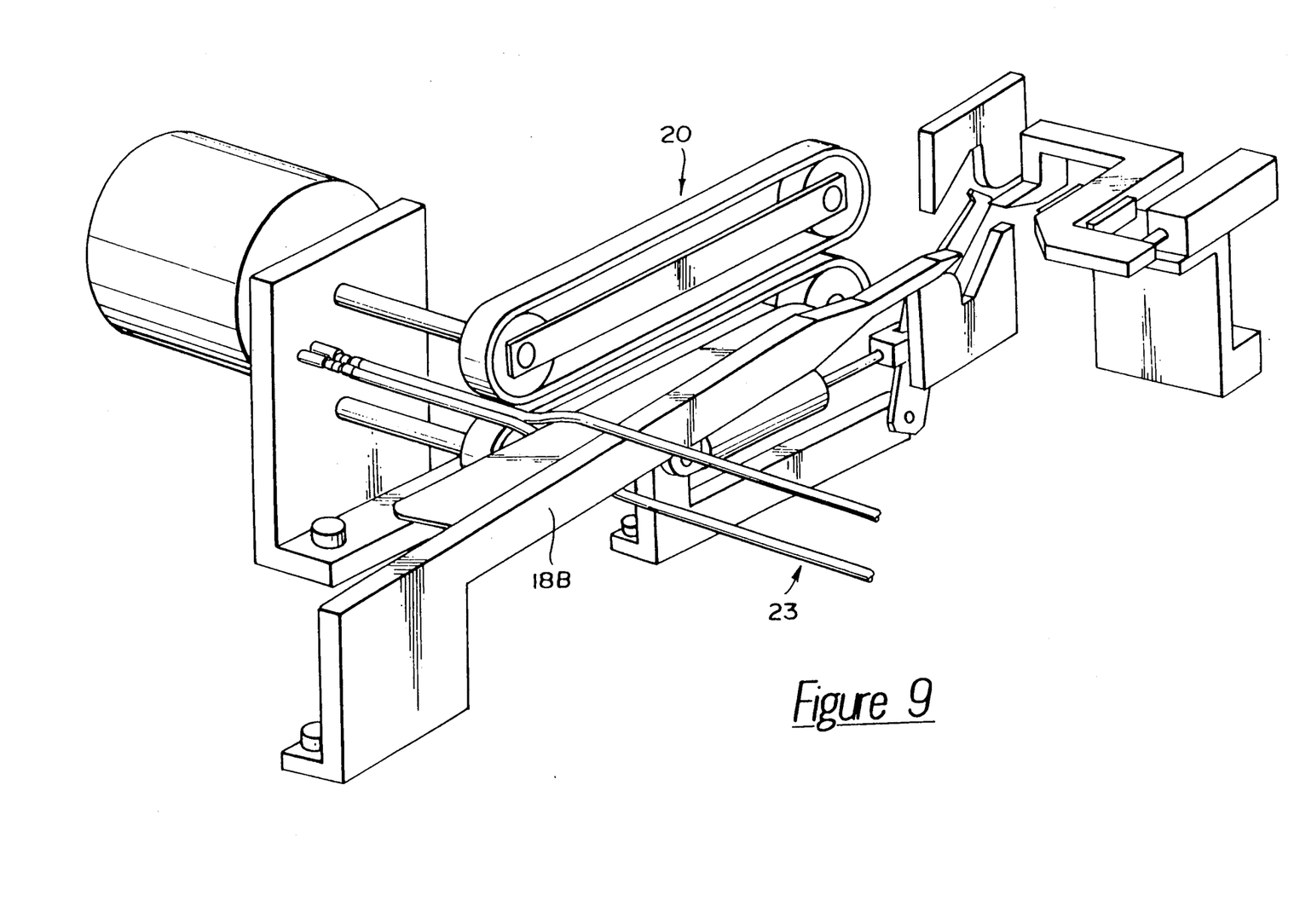

In this manner, the wire harness 23 in a form of Y-shaped leads is transferred to the left end of the guide rail of the guide member 18 as shown in FIG. 9. Newly made wire harnesses 23 are sequentially transferred and stocked at the left end of the guide rail 18B.

The guide rail 18B remains between the two leads (2, 3) of the wire harnesses 23 which are accumulated automatically with one leads above the guide rail 18B and the other leads below the guide rail 18B. Such automatic identification of the lead wires eliminates the need for manual identification in subsequent wire harness assembling, thereby significantly improving assembly efficiency.

It is to be noted that any known mechanism may be used for the vertical movement of the pair of jaw members 12A, 12B. For example, the upper and lower jaw members 12A, 12B may be supported on vertically movable guide frames each having pins at both ends to engage with the members 12A, 12B. A rotary lever rotatably supported at the center is rotated back and forth to move the jaw members up and down. Racks opposed to the sides of the both jaw members may be formed to place a pinion between the opposed racks, thereby moving the jaw members vertically as the pinion rotates.

We claim:

1. An apparatus for forming a wire harness (23) from a pair of wires (2, 3) and to orientate the wires (2, 3) in a specific orientation, said apparatus comprising:

a pair of jaw means (12) for orientating a pair of wires (2, 3) in a specific relation to each other and to hold said wires (2, 3) adjacent to each other and in said specific relation;

an identification member (14) having spreader means (14A) thereon for insertion between said adjacent wires after said jaw means has oriented the pair of wires to maintain said orientation therebetween (2, 3) to maintain said orientation therebetween;

terminating means (10, 28) for terminating one ends of said wires (2, 3) to a common terminal (C) to form a wire harness (23) after the spreader means has spread the wires;

transfer means (24) for transferring said wire harness (23) normally to the longitudinal axis thereof and from said jaw means (12) after the one ends of the wires have been terminated to the common terminal; and a guide member (18) for receiving said wire harness, said guide member (18) including a front edge (18A) facing said spreader means (14A) and adapted to be inserted between said wires (2,3) to maintain the orientation therebetween before a withdrawal of said spreader means.

2. In the apparatus of claim 1, said jaw means (12) include a pair of jaws (12A, 12B) each having wire guiding surfaces (12A1; 12A2, 12B1, 12B2) for guiding said wires into a specific orientation.

3. In the apparatus of claim 1, said guide member further having a guide rail (18B) for receiving and storing a wire harness (23) with the wires (2, 3) thereof maintained in a specific orientation.

4. In the apparatus of claim 3 further including conveyor means (20) for advancing said wire harness (23) along said guide rail (18B) after said wires have been terminated to the common terminal.

* * * * *